US008966701B2

(12) United States Patent
Dellecave et al.

(10) Patent No.: US 8,966,701 B2
(45) Date of Patent: Mar. 3, 2015

(54) SOLE WIPE

(76) Inventors: Joseph Dellecave, Union, KY (US);
Sophia Dellecave, Union, KY (US);
Olivia Dellecave, Union, KY (US)

( * ) Notice: Subject to any disclaimer, the term of this patent is extended or adjusted under 35 U.S.C. 154(b) by 86 days.

(21) Appl. No.: 13/517,663

(22) Filed: Jun. 14, 2012

(65) Prior Publication Data
US 2013/0333137 A1    Dec. 19, 2013

(51) Int. Cl.
A63B 57/00    (2006.01)
A47L 23/00    (2006.01)
A47L 25/00    (2006.01)

(52) U.S. Cl.
USPC ............. 15/210.1; 15/209.1; 15/223; 15/227; 2/242

(58) Field of Classification Search
USPC ............. 15/208, 209.1, 210.1, 223, 227, 231, 15/232; 2/23, 242; 602/23, 26, 27
See application file for complete search history.

(56) References Cited

U.S. PATENT DOCUMENTS

| 327,759 | A | | 10/1885 | Boyle | |
|---|---|---|---|---|---|
| 722,863 | A | * | 3/1903 | Lodge | 15/227 |
| 1,293,700 | A | | 2/1919 | Calrson | |
| 2,693,610 | A | * | 11/1954 | Hensley, Jr. | 15/104.002 |
| 3,826,407 | A | | 7/1974 | Keating | |
| D288,743 | S | | 3/1987 | Taylor | |
| 4,862,436 | A | * | 8/1989 | Harilela | 368/282 |
| 5,042,091 | A | | 8/1991 | Tonkens | |
| 5,555,564 | A | | 9/1996 | Welch | |
| 5,765,233 | A | | 6/1998 | Hayes | |
| 5,893,190 | A | * | 4/1999 | Mertz | 15/209.1 |
| 6,003,190 | A | | 12/1999 | Knudsen | |
| 6,280,529 | B1 | | 8/2001 | Meyer | |
| 6,405,403 | B1 | * | 6/2002 | McKay | 15/228 |
| 7,653,961 | B2 | * | 2/2010 | Probasco | 15/220.1 |
| D645,246 | S | | 9/2011 | Miller et al. | |
| 2004/0031120 | A1 | * | 2/2004 | Cherian | 15/227 |
| 2004/0040109 | A1 | * | 3/2004 | Lee | 15/208 |
| 2007/0157355 | A1 | | 7/2007 | Katsin | |
| 2008/0190974 | A1 | | 8/2008 | Finn | |
| 2008/0190975 | A1 | | 8/2008 | Naughton | |
| 2009/0119857 | A1 | * | 5/2009 | Yurman et al. | 15/105 |
| 2009/0293215 | A1 | * | 12/2009 | Zhou | 15/210.1 |
| 2013/0091614 | A1 | * | 4/2013 | Teets et al. | 2/51 |

FOREIGN PATENT DOCUMENTS

JP    10-165353    *    6/1998

* cited by examiner

*Primary Examiner* — Mark Spisich
(74) *Attorney, Agent, or Firm* — Steve Witters; Witters & Associates

(57) ABSTRACT

Disclosed herein is a sole wipe configured to dispose one or more removable cleaning pads about the inside of a calf or lower leg of a user. The sole wipe may comprise a single or a plurality of removable cleaning pads. A plurality of cleaning pads may be disposed in a stacked configuration. The sole wipe also comprises a securing device configured and disposed to releasably secure each removable cleaning pad about the inside of a calf or lower leg of the user. The sole wipe may also be configured to dispose one or more cleaning pads about an ankle brace. The sole wipe may also comprise a base configured to be secured about the inside of a calf or lower leg of a user with the securing device and dispose the one or more cleaning pads therewith.

6 Claims, 5 Drawing Sheets

SOLE WIPE

FIELD OF THE DISCLOSURE

This disclosure relates to sporting equipment, and more specifically to a device configured to provide a means for wiping the sole of a shoe while engaged in a sporting event.

BACKGROUND

Athletes who participate in sports played on smooth hard surfaces such as basketball, volley ball, handball, squash or racquetball courts may improve their traction by periodically wiping, cleaning, drying, and/or slightly moistening their shoe soles. For example, dust and other debris may accumulate on shoe soles during the course of play and decrease the coefficient of friction between the shoe soles and the court surface. To increase traction or decrease the coefficient of friction between the shoe soles by removing the dust and debris, drying, and or moistening, athletes typically wipe their shoes on a towel between playing periods. During playing periods there is seldom time to exit the court and wipe one's shoe soles.

What is needed is a sole wipe that provides one actively engaged in a sporting event the ability to wipe soles of their shoes while remaining active in the sporting event.

SUMMARY

In one aspect of the present disclosure, a sole wipe is configured to dispose a plurality of removable cleaning pads about the inside of a calf or lower leg of a user, the sole wipe comprises a plurality of removable cleaning pads disposed in a stacked configuration, and a securing device configured and disposed to releasably secure each the plurality of removable cleaning pads about the inside of a calf or lower leg of the user.

In another aspect of the present disclosure, a sole wipe is configured to be disposed with an ankle brace and dispose at least one removable cleaning pad on the inside of a calf or lower leg of a user, the sole wipe comprises at least one removable cleaning pad configured to be disposed with an ankle brace about the inside of a calf or lower leg of a user, and a securing device configured to releasably secure the at least one removable cleaning pad about the ankle brace and to dispose the at least one removable cleaning pad about the inside of a calf of the user.

In yet another aspect of the present disclosure, a sole wipe is configured to dispose at least one removable cleaning pad on the inside of a calf or lower leg of a user, the sole wipe comprises a semi-rigid base, at least one removable cleaning pad disposed with the base, and a securing device configured and disposed to releasably secure the semi-rigid base about the lower leg of the user and to dispose and bend the at least one removable cleaning pad about the inside of a calf of the user.

BRIEF DESCRIPTIONS OF THE DRAWINGS

The following figures, which are idealized, are not to scale and are intended to be merely illustrative of aspects of the present disclosure and be non-limiting. In the drawings, like elements may be depicted with like reference numerals. The drawings are briefly described as follows.

Figure 6:
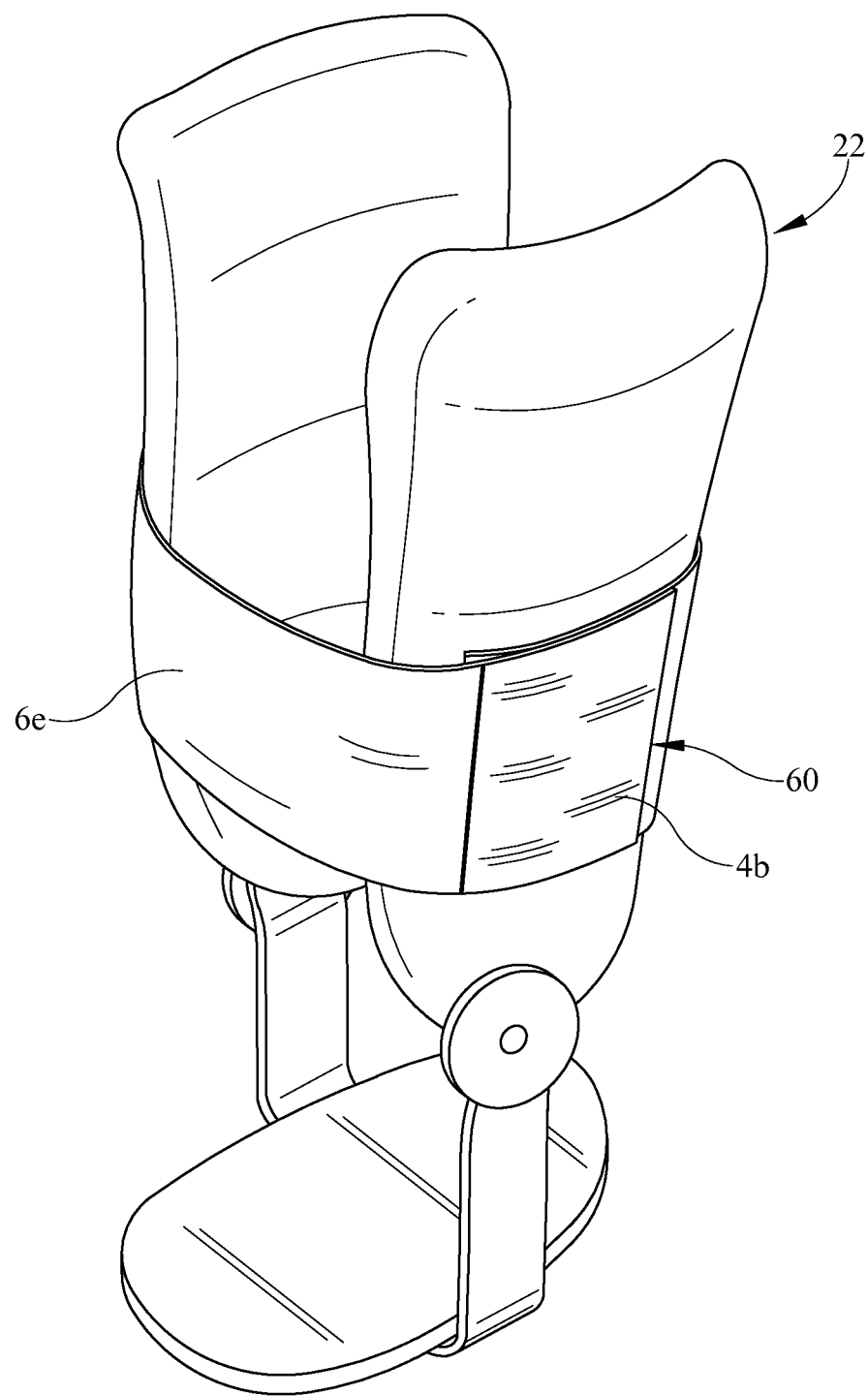
Figure 7:
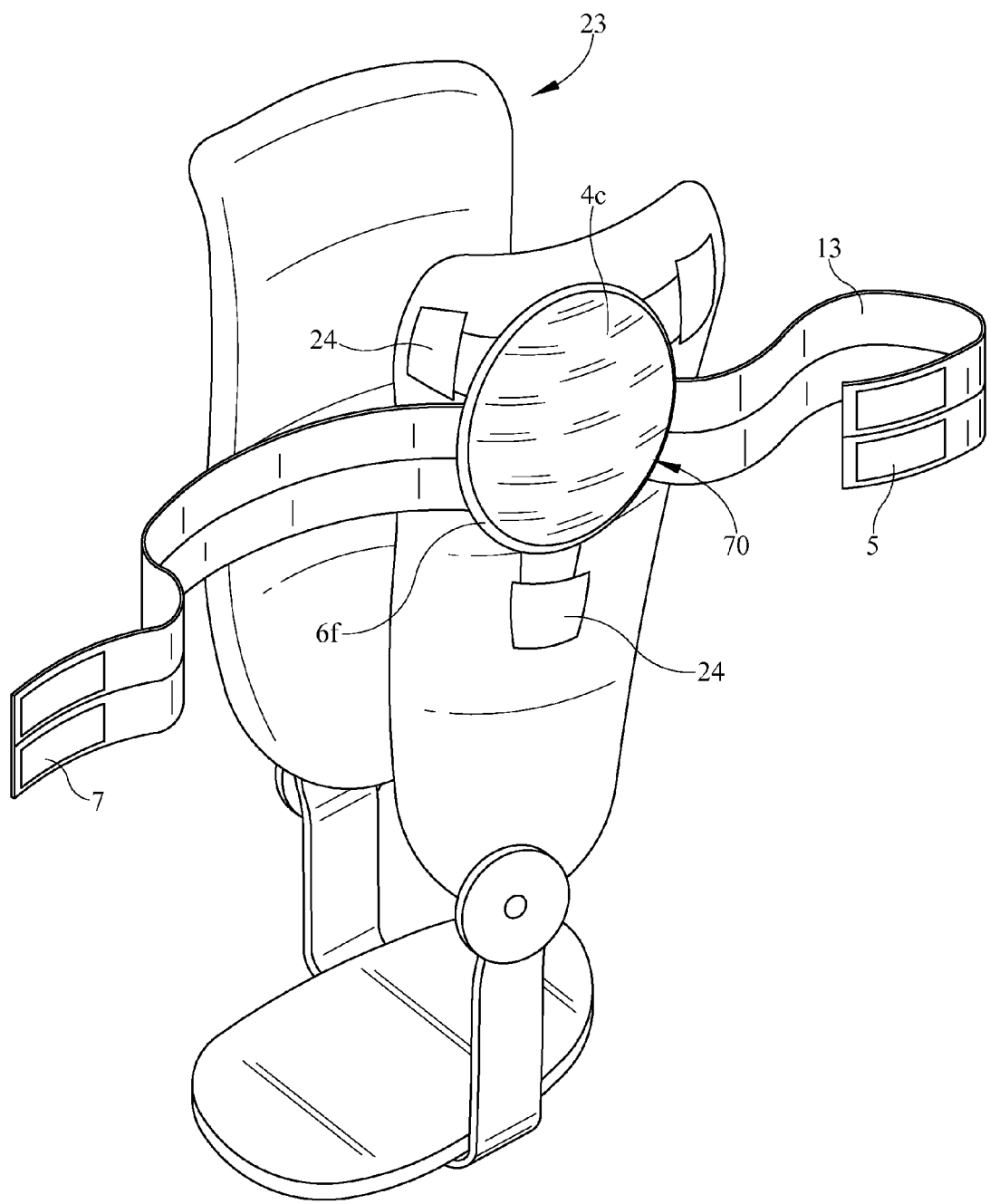

FIG. 6 is a front view of yet another aspect of the sole wipe of the present disclosure wherein the base and securing device are a single component and the sole wipe is shown disposed about an ankle brace; and FIG. 7 is a front view of a further aspect of the sole wipe of the present disclosure wherein the base is shown secured to a securing device having a portion incorporated with an ankle brace.

DETAILED DESCRIPTION

Figure 1:
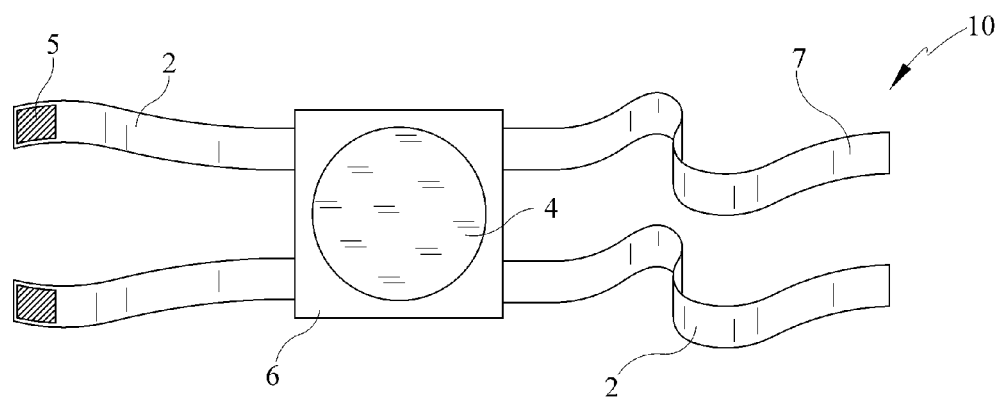
FIG. 1 is a front view of a sole wipe of the present disclosure wherein the sole wipe is disposing a pad on a base.

FIG. 1 shows sole wipe 10 of the present disclosure. Sole wipe 10 is configured to dispose one or a plurality of removable cleaning pad(s) 4 on the inside of a calf or lower leg of a user. Base 6 is shown disposing cleaning pad(s) 4. Cleaning pad(s) 4 may be removable from base 6 and/or other cleaning pad(s) 4. For example, in at least one aspect of the present disclosure, a single cleaning pad 4 is permanently or removably secured to base 6. In this respect, sole wipe 10 and/or cleaning pad 4 may be worn during a entire sporting activity and may be removed and replaced, cleaned, or treated prior to beginning another event or activity. In at least one other aspect, a plurality of removable cleaning pads 4 are disposed in a stacked configuration on base 6. In this respect, a cleaning pad 4 may be worn during a portion of a sporting activity and may be removed from an underlying cleaning pad 4. This may provide for the outer cleaning pad 4 to be removed to dispose an unused cleaning pad 4 on the outer surface of base 6 during the sporting activity. Securing device 2 may be configured and disposed to releasably secure base 6 around the lower leg of the user and dispose one or more removable cleaning pad(s) 4 on the inside of the calf of the user.

Sole wipe 10 may have a securing device comprising straps 2 secured to base 6. Each strap 2 may have a connector, 5 or 7, configured and disposed to removably connect to another connector, 7 or 5, disposed with an extension of strap 2 or another strap 2. Connectors 5 and 7 may be any connector as known by persons having ordinary skill in the art. For example, connectors 5 and 7 may be hook and loop connectors wherein one of connectors 5 and 7 has hooks and the other of connectors 5 and 7 have loops. Alternatively, one of connectors 5 and 7 may have a male fitting and the other of connectors 5 and 7 may have a female fitting. Other and different connectors may be used to connect straps 2 about the lower leg.

Sole wipe 10 may be configured to dispose a plurality of removable cleaning pads 4 about the inside of a calf or lower leg of a user. For example, sole wipe 10 may comprise a plurality of removable cleaning pads 4 disposed in a stacked configuration. A securing device may be configured and disposed to releasably secure each of the plurality of removable cleaning pads 4 about the inside of a calf or lower leg of the user. Sole wipe 10 may have a plurality of removable cleaning pads 4 configured to be releasably secured to an adjacent removable cleaning pad 4. For example, each cleaning pad 4 may have a releasable adhesive for removably securing it to an adjacent underlying cleaning pad 4. Removable cleaning pads 4 may comprises an absorbent material.

Figure 2:
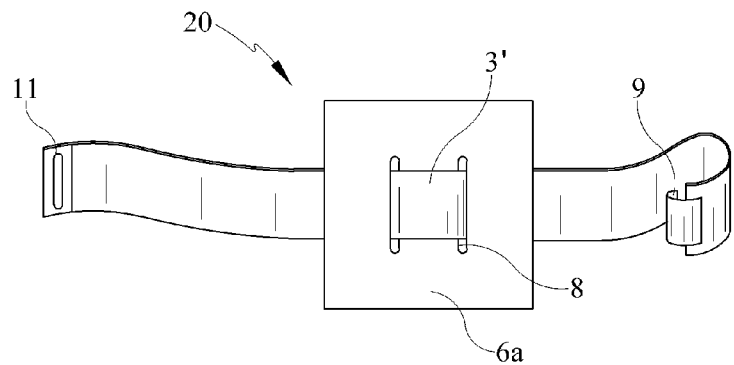
FIG. 2 is a front view of another aspect of the sole wipe of the present disclosure wherein the sole wipe has the pad removed showing a base configured to be secured on the inside of a calf or lower leg of a user with a securing device comprising a sole strap.

FIG. 2 shows sole wipe 20 having pad(s) 4 removed therefrom and shows base 6a configured to be secured on the inside of a calf or lower leg of a user with a securing device comprising a sole strap 3'. Base 6a may have slots 8 configured to receive strap 3'. For example, slots 8 may extend a substantial portion of the height of base 6a and may tightly receive strap 3', thereby minimizing rotation of base 6a about the lower leg during play. Strap 3' is shown to have hook 9 and hook receiver 11 secured on terminal ends thereof. Hook 9 and hook receiver 11 may be configured to releasably cooperate with one another to secure base 6a about the lower leg of a user. It is to be understood that any releasable locking mechanism as is known by persons having ordinary skill in the art may be used to releasably connect ends of strap 3' together.

Base 6a is shown to have a rectangular configuration in the aspect of sole wipe 20. However, it is to be understood that bases 6-6f, shown in FIGS. 1-7, may have most any configuration. In at least one aspect of the present disclosure, bases 6-6f may have a height greater than or equal to a width thereof. In this aspect, the base may maximize the surface area disposed on the inside of the lower leg of the user. The base may be comprised of a semi-rigid material, such as a polymeric material. A semi-rigid base may allow curvature about the calf and provide support to the one or more cleaning pad(s) 4 disposed thereon.

Sole wipe 20 may comprise a base 6a configured to dispose a single or a plurality of cleaning pads 4. A cleaning pad 4 may be unitary with base 6a or base 6a may dispose a plurality of releasable cleaning pads 4. Base 6a may comprise two slots 8 and the securing device may comprise a strap 3' configured to pass through each slot 8. Slots 8 and strap 3' may be configured to secure base 6a about the calf and to minimize rotation of sole wipe 20 about the calf. Strap 3' may have a connector 9 and 11 proximate each end thereof.

Figure 3:
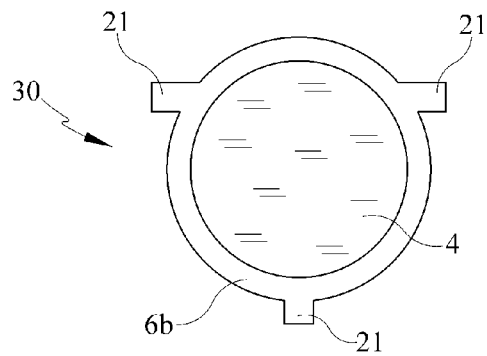
FIG. 3 is a front view of yet another aspect of the sole wipe of the present disclosure wherein the base is configured to be secured on the inside of a calf or lower leg of a user with an ankle brace.

FIG. 3 shows sole wipe 30 having base 6b configured to be secured on the inside of a calf or lower leg of a user with an ankle brace (not shown). Sole wipe 30 may have base 6b with tabs 21 extending from a perimeter thereof. Tabs 21 may be configured and disposed to be received by slots in an ankle brace. Base 6b may be semi-rigid and configured to be bowed, placed on ankle brace, and released wherein tabs 21 are received by slots on the ankle brace. It is to be understood that other and different securing mechanisms may be incorporated with an ankle brace and pad(s) 4.

In at least one aspect of the present disclosure, a base may be incorporated with an ankle brace. For example, an inner surface of an ankle brace (surface of ankle brace facing other ankle brace or other calf) may comprise a portion of a securing device, such as hooks, and the base may have a surface configured to be releasable secured to the base, such as loops.

Cleaning pad(s) 4-4c, shown in FIGS. 1, and 3-7, are configured for wiping the sole of a shoe while actively engaged in a sporting activity. It is to be understood that a sole wipe may be worn about each calf to provide for wiping of the sole of each shoe. It is also to be understood that the cleaning pads may have most any configuration. In at least one aspect of the present disclosure, the cleaning pads have a configuration and size proximate the configuration and size proximate to that of a base which it is configured to be releasably secured thereto. Further, it is to be understood that the cleaning pads may be comprised of most any material. In at least one aspect of the present disclosure, the cleaning pads are comprised of an absorbent material. Absorbent cleaning pads may be used to absorb moisture from the sole of a shoe thereby maintaining a maximum coefficient of friction between the sole of the shoe and a court, such as a basketball or volleyball court. Absorbent cleaning pads may also be used to absorb a cleaning solution for increasing the removal of oils or other materials from the sole of the shoe. The cleaning pads disclosed herein may be configured a variety of ways is known in the art to increase traction between the sole of a shoe and the surface being played upon. For example, the cleaning pads may comprise a substance, in powder or liquid form, or otherwise chemically treated for increasing traction. Alternatively or additionally, the cleaning may be electrically charged and/or physically configured to clean the soles of the shoes or otherwise increase traction.

Sole wipe 30 may be configured to dispose at least one removable cleaning pad 4 on the inside of a calf or lower leg of a user. Sole wipe 30 may comprise a semi-rigid base 6b. At least one removable cleaning pad 4 may be disposed with base 6b. Base 6b may incorporate a single cleaning pad 4 or may support a plurality of cleaning pads 4 releasably secured to a surface thereof. A securing device may be configured and disposed to releasably secure semi-rigid base 6b about the lower leg of the user and to dispose and bend at least one removable cleaning pad 4 about the inside of a calf of the user. For example, the securing device may comprise tabs 21 configured and disposed to cooperate with connectors on an ankle brace. Base 6b may be configured to dispose one, or a plurality of cleaning pads 4 therewith. For example, sole wipe 30 may have base 6b configured to dispose one cleaning pad 4 therewith. A base 6b may be unitary with a cleaning pad 4 and both base 6b and cleaning pad 4 may be removable from an ankle brace as a single unit. In at least one aspect of the present disclosure, sole wipe 30 is configured to have a plurality of sole wipes 30 disposed with an ankle brace in a stacked configuration.

Figure 4:
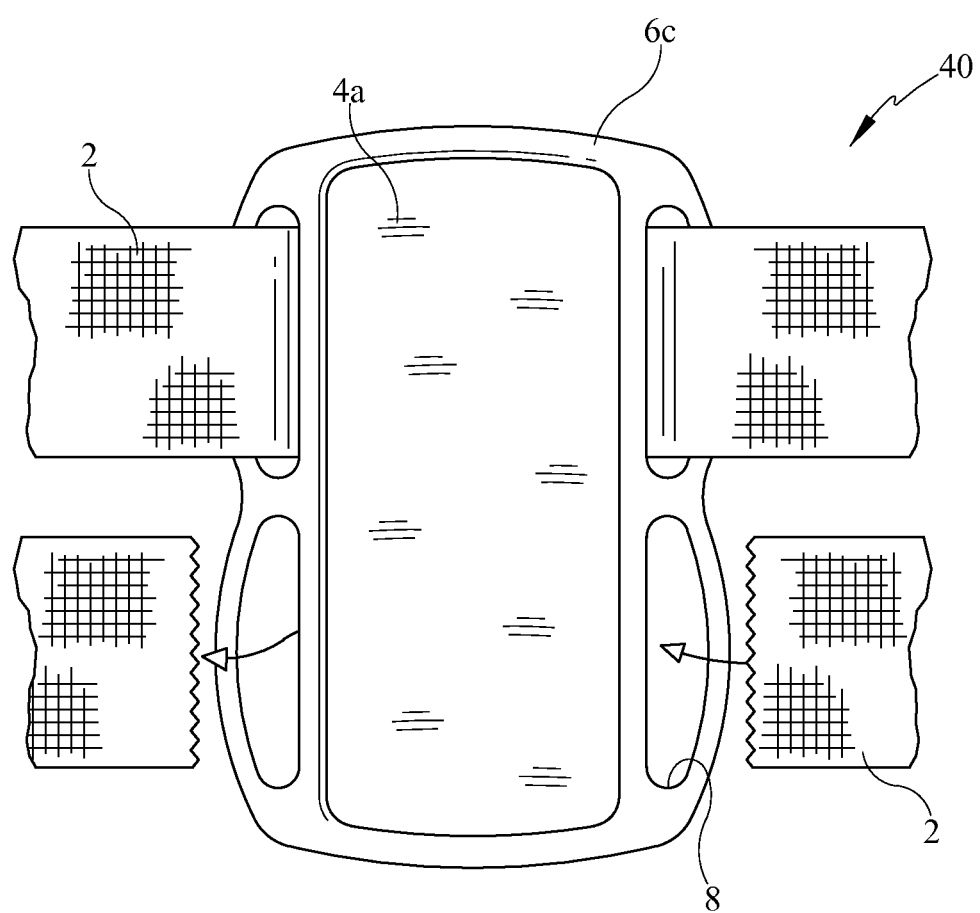
FIG. 4 is a front view of a further aspect of the sole wipe of the present disclosure wherein the sole wipe is disposing at least one pad on a base and the securing device comprises two straps.

FIG. 4 shows sole wipe 40 disposing at least one pad 4a on base 6c and a securing device comprising two straps 2. Base 6c has an upper and lower slot 8 disposed proximate each longitudinal side thereof. Upper slots 8 are proximate an upper edge of base 6c and lower slots 8 are proximate a lower edge of base 6c. Base 6c is configured to longitudinally extend about the calf with one longitudinal end proximate an ankle and the other longitudinal end proximate the knee. Slots 8 may be configured to receive straps 2 and to minimize rotation of base 6c about the calf. For example, sole wipe 40 may have narrow slots 8 and narrow straps 2, providing a larger gap therebetween than the gap shown in FIG. 4. Additionally, having slots 8 proximate the longitudinal edges of base 6c may provide an uninterrupted surface of base 6c for removable securing one or more cleaning pads 4a.

Figure 5:
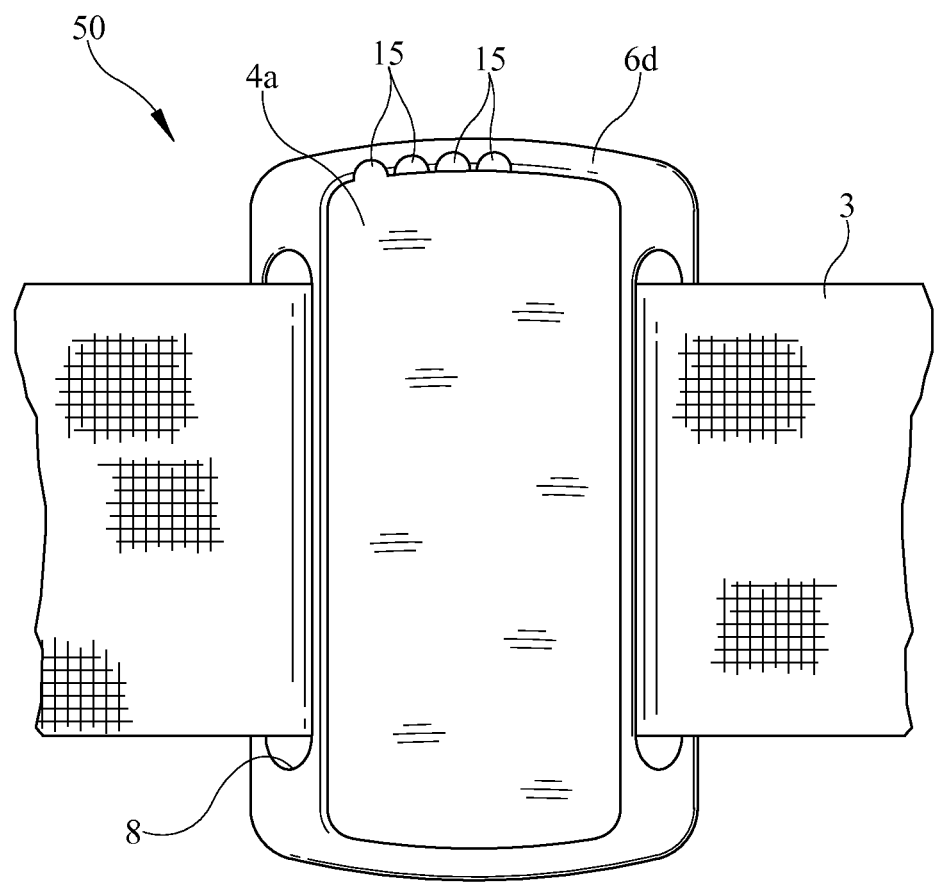
FIG. 5 is a front view of another aspect of the sole wipe of the present disclosure wherein the sole wipe is disposing at least one pad on a base and the securing device comprises a single strap.

FIG. 5 shows sole wipe 50 disposing at least one pad 4a on base 6d and a securing device comprising a sole strap 3. Base 6d has a sole slot 8 disposed proximate each longitudinal side thereof. Each slot 8 extends proximate an upper edge of base 6d to proximate a lower edge of base 6d. Slots 8 may be configured to receive straps 3 and to minimize rotation of base 6d about the calf during a sporting match. For example, sole wipe 50 may have wide slots 8 and a wide strap 3, as shown in FIG. 5.

Sole wipe 50 may have each removable cleaning pad 4a with a portion 15 extending beyond a perimeter of the adjacent removable cleaning pad 4a. For example, tabs 15. In at least one aspect, base 6d is configured to support a plurality of cleaning pads 4a in a stacked configuration wherein each cleaning pad 4a has a tab 15 misaligned with a tab 15 of an adjacent cleaning pad 4. In this aspect, each cleaning pad 4 may have a releasable adhesive securing it to the adjacent pad 4 wherein an unused cleaning pad 4 may be exposed by peeling off the outer used cleaning pad 4 with its tab 15.

Sole wipe 50 may have slots 8 proximate a perimeter of base 6d and strap 3 may be configured to configured to pass through each two slot 8 without contacting cleaning pad(s) 4a. Sole wipe 50 may be configured to dispose at least one removable cleaning pad 4a on the inside of a calf or lower leg of a user. Sole wipe 50 may comprise a semi-rigid base 6d. At least one removable cleaning pad 4a may be disposed with base 6d. A securing device may be configured and disposed to releasably secure a semi-rigid base 6d about the lower leg of the user and to dispose and bend at least one cleaning pad 4a about the inside of a calf of the user. Base 6d may be configured to dispose one or a plurality of removable cleaning pad(s) 4a therewith. Sole wipe 50 may be configured to be disposed directly about the calf of a user or about an ankle brace.

FIG. 6 shows sole wipe 60 having a base and a securing device as a single component 6e and shows sole wipe 60 disposed about an ankle brace 22. Sole wipe 60 may be disposed directly about the calf or may be disposed about an ankle brace 22 as shown in FIG. 6. In this aspect of the present disclosure, sole wipe 60 may comprise base and securing device 6e configured to dispose one or more cleaning pad(s) 4b on a surface as shown. Base and securing device 6e may be comprised of an elastic material. Ankle brace 22 may provide a rigid support for pad(s) 4b as may be desired. In at least one aspect, base and securing device 6e has a coefficient of friction or a retainer sufficient to prevent sliding of sole wipe 60 in a longitudinal direction about the calf or ankle brace 22.

Sole wipe 60 may be configured to be disposed about an ankle brace 22. One or a plurality of removable cleaning pads 4b may be configured to be disposed over a portion of ankle brace 22 that is to be disposed about the inside of a calf or lower leg of a user. Sole wipe 60 may comprise one or a plurality of removable cleaning pads 4b configured to be removably secured directly to ankle brace 22. Sole wipe 60 may be configured to be disposed with ankle brace 22 and dispose at least one removable cleaning pad 4b on the inside of a calf or lower leg of a user. Sole wipe 60 may comprise at least one removable cleaning pad 4b configured to be disposed with ankle brace 22 about the inside of a calf or lower leg of a user. Sole wipe 60 may comprise a securing device configured to releasably secure at least one removable cleaning pad 4b about ankle brace 22 and to dispose at least one removable cleaning pad 4b about the inside of a calf of the user.

FIG. 7 shows sole wipe 70 wherein base 6f is secured with securing device 24 incorporated with an ankle brace 23. Strap 13 may be a component part of ankle brace 23 and may not be needed to secure sole wipe 70 to ankle brace 23. In this respect, base 6f may be void of slots and may have tabs or other retaining features such as, clips, clasps, snaps, hooks or loops, configured to cooperate with securing device 24 and removably secure sole wipe 70 to ankle brace 23. Cleaning pad(s) 4c may be removable from base 6f or unitary therewith. For example, base 6f and cleaning pad 4c may be a single removable and disposable unit. In this respect, the sole wipe may be considered to be void of a base. Sole wipe 70 may be configured to have a plurality of sole wipes 70 disposed in a stacked configuration on ankle brace 23 with securing device 24.

Sole wipe 70 may comprise a base 6f configured to be disposed with an ankle brace 23 by connecting therewith and dispose at least one removable cleaning pad 4c. Base 6f may be configured to connect with ankle brace 23 and dispose at least one removable cleaning pad 4c therewith. Sole wipe 70 may comprise a plurality of removable cleaning pads 4c configured to be disposed in a stacked configuration about ankle brace 23. Sole wipe 70 may comprise a securing device having connectors extending from base 6f configured and disposed to connect base 6f to ankle brace 23. For example, the connectors may be tabs 21, as shown in FIG. 3, and ankle brace 23 may have connectors 24 configured to receive tabs 21. Sole wipe 70 may comprise a semi-rigid base 6f and the securing device may comprises a plurality of tabs 21, shown in FIG. 3, extending from base 6f beyond an outer perimeter of the at least one removable cleaning pad 4c. Tabs 21 may be configured and disposed to cooperate with connectors 24 having slots in the ankle brace. Removable cleaning pad(s) 4c may each be unitary with its own base 6f.

Sole wipe 70 may be configured to dispose a plurality of removable cleaning pads 4c in a stacked configuration. Sole wipe 70 may be configured to dispose at least one removable cleaning pad 4c on the inside of a calf or lower leg of a user. Sole wipe 70 may comprise a semi-rigid base 6f with at least one removable cleaning pad 4c disposed therewith and a securing device configured and disposed to releasably secure semi-rigid base 6f about the lower leg of the user and to dispose and bend the at least one removable cleaning pad 4c about the inside of a calf of the user. Sole wipe 70 may be configured to dispose a plurality of removable cleaning pads 4c therewith, in a stacked configuration for example. Sole wipe 70 may have base 6f configured to dispose one removable cleaning pad 4c therewith.

In at least one aspect of the present disclosure, sole wipe 70 comprises a plurality of bases 6f, each disposing a sole cleaning pad 4c. Ankle brace 23 may have connectors 24 configured to connect a plurality of sole wipes 70 in a stacked configuration.

Aspects of the present disclosure provide a sole wipe for wiping the sole of a shoe while actively engaged in a sporting event. The sole wipe comprises at least one cleaning pad. The cleaning pad may be comprised of an absorbent material. The sole wipe may also comprise a base configured to dispose at least one cleaning pad on the inside of a calf. The base may be a separate component part, a part of an ankle brace, or a part of a supporting device. In at least one aspect of the present disclosure, the sole wipe is void of a base.

The invention is illustrated by example in the drawing figures, and throughout the written description. It should be understood that numerous variations are possible while adhering to the inventive concept. Such variations are contemplated as being a part of the present disclosure.

The invention claimed is:

1. A sole wipe configured to dispose a plurality of removable cleaning pads about the inside of a calf or lower leg of a user, said sole wipe comprising:
   a plurality of removable cleaning pads disposed in a stacked configuration and releasably secured with an adhesive to an adjacent removable cleaning pad;
   each said removable cleaning pad having substantially the same surface area and a tab misaligned with the tab of the adjacent removable cleaning pad, each tab extending beyond a perimeter of the adjacent removable cleaning pad;
   a securing device configured and disposed to releasably secure each said plurality of removable cleaning pads about the inside of a calf or lower leg of the user; and
   a base configured to dispose said plurality of removable cleaning pads, said base comprises at least one slot and said securing device comprises a strap configured to pass through said at least one slot, said at least one slot and said strap being configured to secure said base about the calf.

2. The sole wipe of claim 1 wherein, said base comprises two slots and said strap is configured to pass through each said two slots, said slots and said strap being configured to secure said base about the calf and to minimize rotation of the sole wipe about the calf.

3. The sole wipe of claim 2 wherein said strap has a connector proximate each end thereof.

4. The sole wipe of claim 3 wherein said slots are proximate a perimeter of said base and said strap is configured to configured to pass through each said two slots without contacting said plurality of removable cleaning pads.

5. The sole wipe of claim 1 wherein each said plurality of removable cleaning pads comprises an absorbent material.

6. A sole wipe configured to dispose at least one removable cleaning pad on the inside of a calf or lower leg of a user, said sole wipe comprising:

a semi-rigid base;

at least two removable cleaning pads disposed with said base, wherein each said cleaning pad is releasably secured to an adjacent removable cleaning pad with an adhesive;

each said removable cleaning pad having substantially the same surface area and a tab misaligned with the tab of the adjacent removable cleaning pad, each tab extending beyond a perimeter of the adjacent removable cleaning pad;

a securing device configured and disposed to releasably secure said semi-rigid base about the lower leg of the user and to dispose and bend said at least two removable cleaning pads about the inside of a calf of the user; and said base comprises at least one slot and said securing device comprises a strap configured to pass through said at least one slot, said at least one slot and said strap being configured to secure said base about the calf.

* * * * *